(12) United States Patent
Kuo et al.

(10) Patent No.: US 11,569,188 B2
(45) Date of Patent: Jan. 31, 2023

(54) SEMICONDUCTOR DEVICE INCLUDING ELONGATED BONDING STRUCTURE BETWEEN THE SUBSTRATE

(71) Applicant: United Microelectronics Corp., Hsinchu (TW)

(72) Inventors: Chung-Hsing Kuo, Taipei (TW); Chun-Ting Yeh, Taipei (TW); Ming-Tse Lin, Hsinchu (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 17/387,755

(22) Filed: Jul. 28, 2021

(65) Prior Publication Data
US 2022/0415836 A1 Dec. 29, 2022

(30) Foreign Application Priority Data
Jun. 23, 2021 (CN) .......................... 202110696592.5

(51) Int. Cl.
*H01L 21/68* (2006.01)
*H01L 23/00* (2006.01)

(52) U.S. Cl.
CPC ............ *H01L 24/06* (2013.01); *H01L 21/681* (2013.01)

(58) Field of Classification Search
CPC ............................. H01L 24/06; H01L 21/681
USPC ........................................................... 257/773
See application file for complete search history.

(56) References Cited

U.S. PATENT DOCUMENTS

| 9,142,517 | B2 | 9/2015 | Liu et al. |
| 10,262,963 | B2 | 4/2019 | Enquist |
| 2014/0252635 | A1* | 9/2014 | Tran ........................ H01L 24/08 257/773 |
| 2021/0028135 | A1* | 1/2021 | Said ........................ H01L 24/89 |

* cited by examiner

*Primary Examiner* — Didarul A Mazumder
(74) *Attorney, Agent, or Firm* — J.C. Patents

(57) ABSTRACT

A semiconductor device, including a first semiconductor substrate and a second semiconductor substrate, is provided. A first bonding structure is located on the first semiconductor substrate and includes a first pad having an elongated shape. A second bonding structure is located on the second semiconductor substrate and includes a second pad having an elongated shape. The first semiconductor substrate is bonded to the second semiconductor substrate by bonding the first bonding structure and the second bonding structure. The first pad is bonded to the second pad, and an extension direction of the first pad is different from an extension direction of the second pad.

18 Claims, 12 Drawing Sheets

SEMICONDUCTOR DEVICE INCLUDING ELONGATED BONDING STRUCTURE BETWEEN THE SUBSTRATE

CROSS-REFERENCE TO RELATED APPLICATION

This application claims the priority benefit of China application serial no. 202110696592.5, filed on Jun. 23, 2021. The entirety of the above-mentioned patent application is hereby incorporated by reference herein and made a part of this specification.

BACKGROUND

Technical Field

This disclosure relates to an integrated circuit, and in particular to a semiconductor device.

Description of Related Art

With the development of semiconductor process technology, a technology for bonding two semiconductor substrates to each other has been developed. The semiconductor substrates are bonded to each other by a bonding structure with pads. However, when an alignment error occurs, it causes the bonding area of the pads to be insufficient, therefore resulting in issues such as decreasing the electrical reliability.

SUMMARY

This disclosure provides a semiconductor device, which may reduce an influence of misalignment on a bonding area of pads, increase the bonding area, and increase flexibility of the design.

The semiconductor device of the disclosure includes a first semiconductor substrate and a second semiconductor substrate. A first bonding structure is located on the first semiconductor substrate and includes a first pad having an elongated shape. A second bonding structure is located on the second semiconductor substrate and includes a second pad having an elongated shape. The first semiconductor substrate is bonded to the second semiconductor substrate by bonding the first bonding structure and the second bonding structure. The first pad is bonded to the second pad, and an extension direction of the first pad is different from an extension direction of the second pad.

In an embodiment of the disclosure, the first pad and the second pad are each respectively a rectangle, a rectangle with rounded corners, an oblong or a parallelogram.

In an embodiment of the disclosure, the extension direction of the first pad and the extension direction of the second pad are perpendicular to each other.

In an embodiment of the disclosure, the extension direction of the first pad and the extension direction of the second pad form an acute angle in-between.

In an embodiment of the disclosure, a ratio of a length to a width of the first pad is the same as a ratio of a length to a width of the second pad.

In an embodiment of the disclosure, the width of the first pad is the same as the width of the second pad.

In an embodiment of the disclosure, the width of the first pad is different from the width of the second pad.

In an embodiment of the disclosure, a ratio of a length to a width of the first pad is different from a ratio of a length to a width of the second pad.

In an embodiment of the disclosure, the width of the first pad is the same as the width of the second pad, or the length of the first pad is the same as the length of the second pad.

In an embodiment of the disclosure, the width of the first pad is different from the width of the second pad, and the length of the first pad is different from the length of the second pad.

In an embodiment of the disclosure, an overlapping region of the first pad and the second pad is a square, a rectangular, or a parallelogram.

In an embodiment of the disclosure, an area of an overlapping region of the first pad and the second pad is smaller than a sum of areas of non-overlapping regions of the first pad that do not overlap the second pad.

In an embodiment of the disclosure, an area of the overlapping region of the second pad and the first pad is smaller than a sum of areas of non-overlapping regions of the second pad that do not overlap the first pad.

In an embodiment of the disclosure, the first pad and the second pad form a "cross" shape or an "X" shape after bonding.

In an embodiment of the disclosure, the first semiconductor substrate further includes a first conductive wire, and the second semiconductor substrate further includes a second conductive wire. The extension direction of the first pad is the same as an extension direction of the first conductive wire and the first pad is connected to the first conductive wire. The extension direction of the second pad is the same as the second conductive wire and the second pad is connected to the second conductive wire.

In an embodiment of the disclosure, a width of the first pad is less than or equal to a width of the first conductive wire.

In an embodiment of the disclosure, a width of the second pad is less than or equal to a width of the second conductive wire.

In an embodiment of the disclosure, the first pad completely overlaps or partially overlaps the first conductive wire, and the second pad completely overlap or partially overlap the second conductive wire.

Based on the above, in the semiconductor device according to the embodiments of the disclosure, by bonding the multiple pads of the two semiconductor substrates, in which the multiple pads have an elongated shape and different extension directions, a uniformed bonding area may be obtained, and the influence of the misalignment on the bonding area of the pads may be reduced, the bonding area is increased, and the flexibility of the design is increased.

To make the aforementioned more comprehensible, several embodiments accompanied with drawings are described in detail as follows.

DESCRIPTION OF THE EMBODIMENTS

Figure 1A:
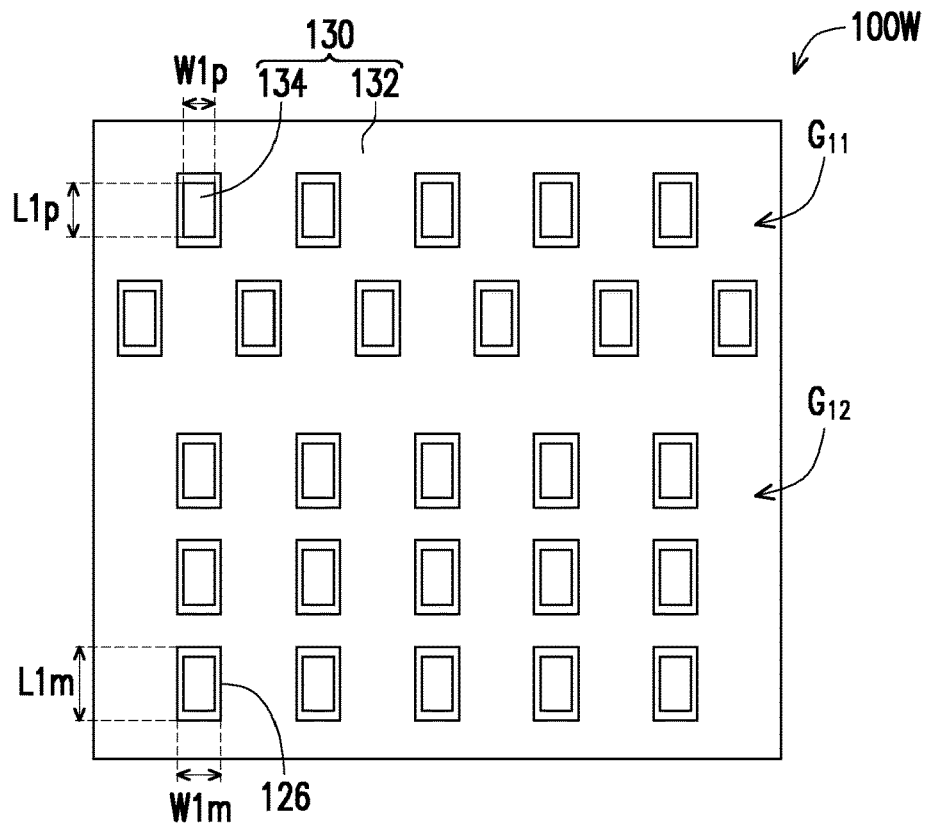
FIGS. 1A and 1B are top views of a manufacturing process of a semiconductor device.
Figure 1A:
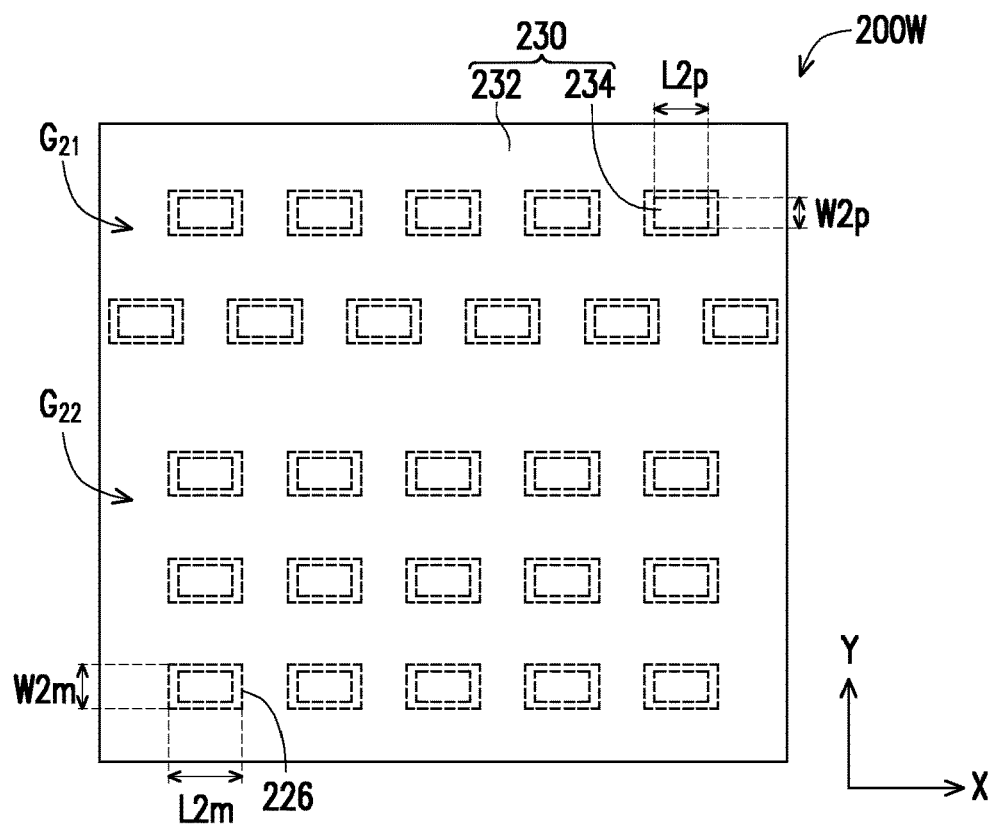
Figure 1B:
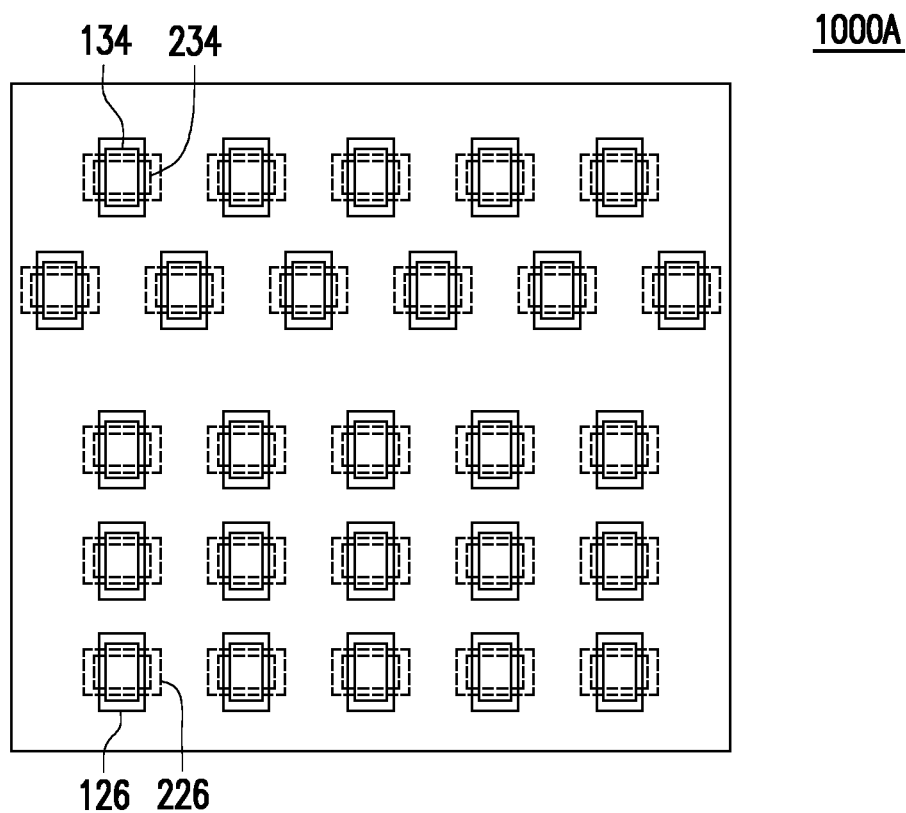
Figure 2A:
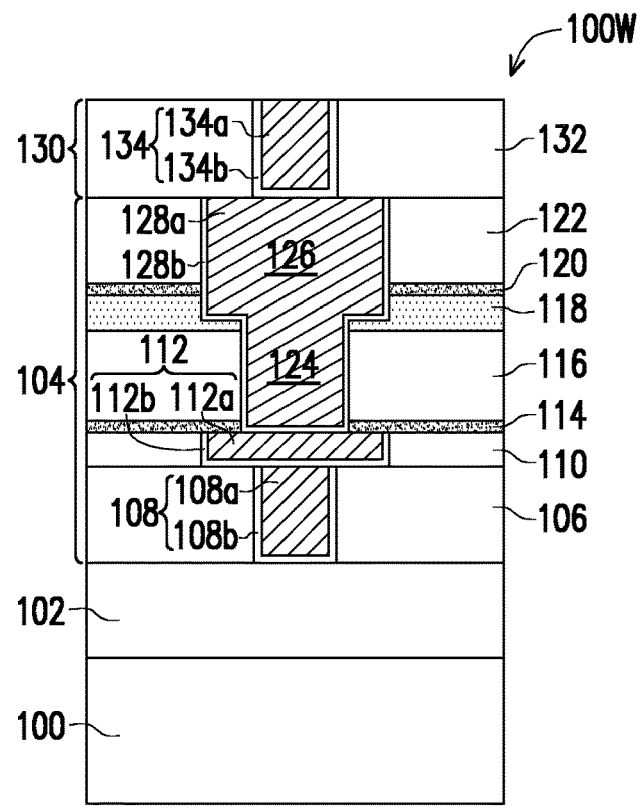
FIGS. 2A and 2B are cross-sectional views of the manufacturing process of the semiconductor device.
Figure 2A:
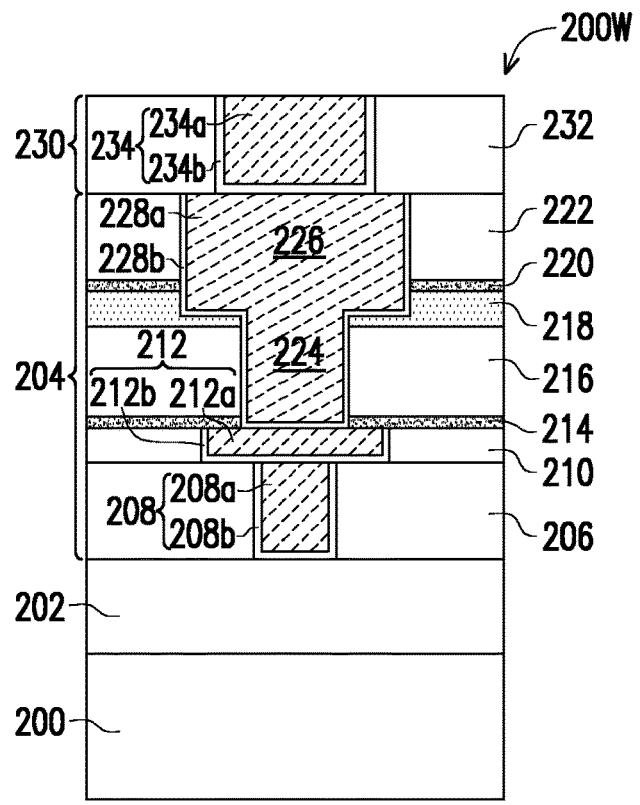
Figure 2B:
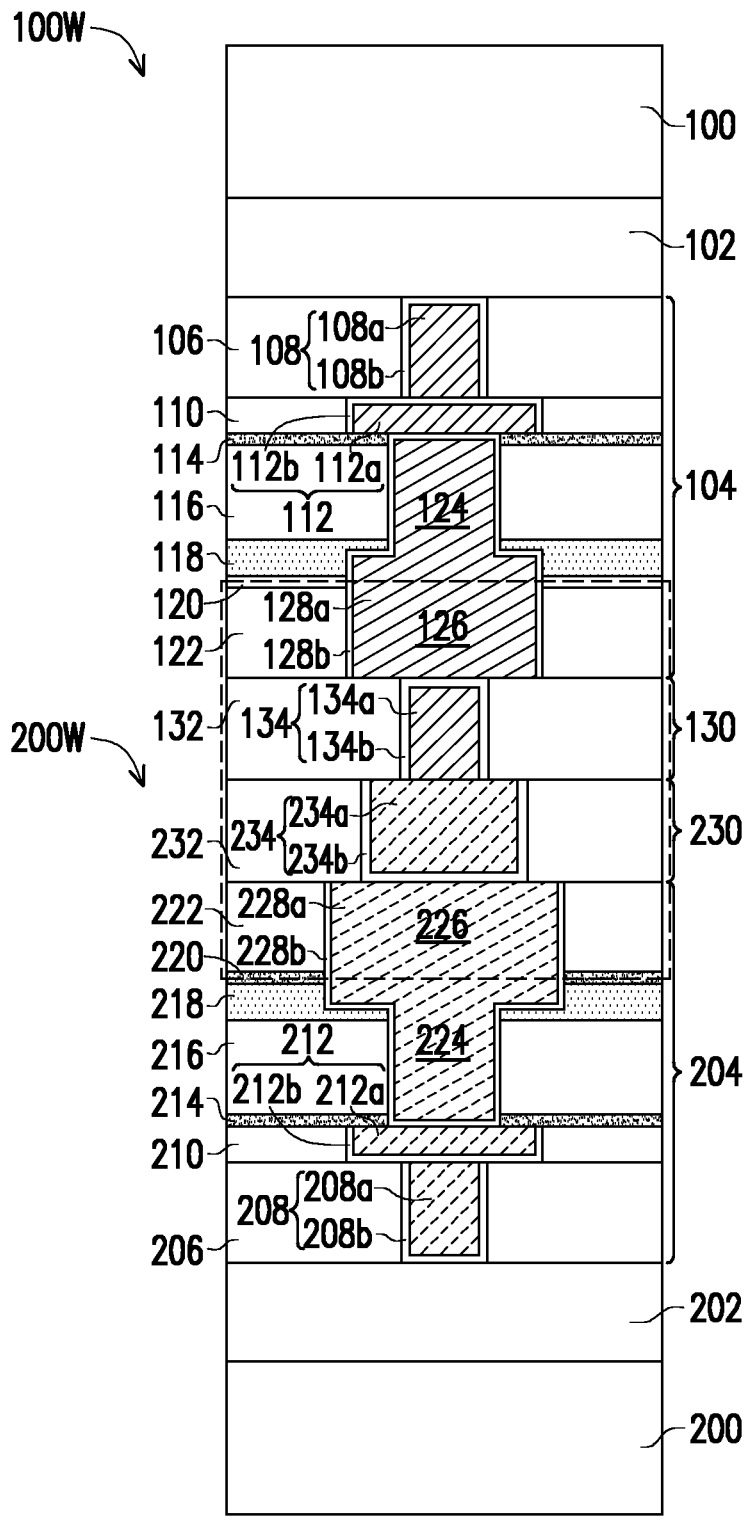
Figure 3A:
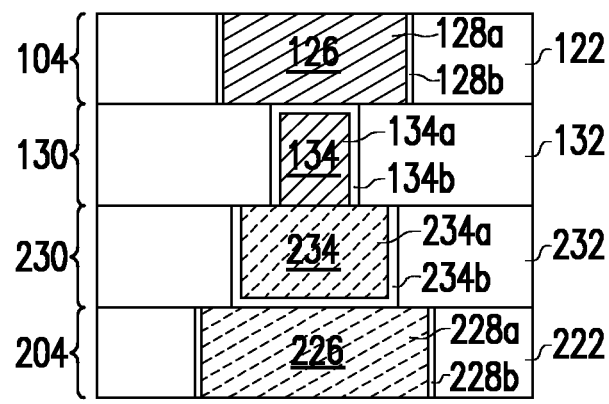
FIG. 3A is a partial enlarged view of FIG. 2B.

FIGS. 1A and 1B are top views of a manufacturing process of a semiconductor device. FIGS. 2A and 2B are cross-sectional views of the manufacturing process of the semiconductor device. FIG. 3A is a partial enlarged view of FIG. 2B.

With reference to FIGS. 1A and 2A, a first semiconductor wafer 100W and a second semiconductor wafer 200W are provided. The first semiconductor wafer 100W includes a first semiconductor substrate 100, a first element layer 102, a first metal internal connection structure 104, and a first bonding structure 130. The second semiconductor wafer 200W includes a second semiconductor substrate 200, a second element layer 202, a second metal internal connection structure 204, and a second bonding structure 230.

Each of the first semiconductor substrate 100 and the second semiconductor substrate 200 may be a doped silicon substrate, an undoped silicon substrate, a silicon-on-insulator (SOI) substrate, or an epitaxial substrate. Dopants of the doped silicon may be P-type dopants, N-type dopants, or a combination thereof. An isolation structure (not shown) may also be formed in the first semiconductor substrate 100 and the second semiconductor substrate 200 to define an active region (not shown).

The first element layer 102 is formed on the first semiconductor substrate 100, and the second element layer 202 is formed on the second semiconductor substrate 200. The first element layer 102 and the second element layer 202 may each respectively include an active element or/and a passive element. The active element is, for example, an element such as PMOS, NMOS, CMOS, JFET, BJT, or a diode. A passive element is, for example, an inductor and a capacitor, etc.

The first metal internal connection structure 104 is located above the first element layer 102. The first metal internal connection structure 104 includes components such as an inner layer dielectric layer 106, a contact window 108, an interlayer dielectric layer 110, a conductive wire 112, an etch stop layer 114, an interlayer dielectric layer 116, hard mask layers 118 and 120, an interlayer dielectric layer 122, a via 124, and a conductive wire 126. In some embodiments, there are other conductive wires, interlayer dielectric layers, and vias between the conductive wire 112 and the via 124, which are not shown.

The inner layer dielectric layer 106 and the interlayer dielectric layers 110, 116, and 122 may be, for example, silicon oxide, and a formation method is, for example, a chemical vapor deposition method or a spin coating method, etc. In some embodiments, the interlayer dielectric layer 110 and the interlayer dielectric layer 116 may use a low-dielectric constant material with a dielectric constant that is lower than 4. The inner layer dielectric layer 106 and the interlayer dielectric layers 110, 116, and 122 may be planarized by a chemical mechanical polishing method or an etch-back method. The etch stop layer 114 is, for example, silicon nitride or silicon oxynitride. The hard mask layer 118 is, for example, silicon oxynitride. The hard mask layer 120 is, for example, silicon nitride. The etch stop layer 114 and the hard mask layers 118 and 120 may be formed by a chemical vapor deposition method.

The contact window 108 is located in the inner layer dielectric layer 106. The conductive wire 112 is located in the interlayer dielectric layer 110. The via 124 and the conductive wire 126 are located in the etch stop layer 114, the interlayer dielectric layer 116, the hard mask layers 118 and 120, and the interlayer dielectric layer 122. The contact window 108, the conductive wire 112, the via 124, and the conductive wire 126 may be electrically connected to each other and to elements in the element layer 102. Materials of the contact window 108, the conductive wires 112 and 126, and the via 124 include doped polysilicon or metal. The metal is, for example, copper, tungsten, or a copper-aluminum alloy. In some embodiments, the contact window 108 includes a metal layer 108a and a barrier layer 108b, the conductive wire 112 includes a metal layer 112a and a barrier layer 112b, the via 124 and the conductive wire 126 include a metal layer 128a and a barrier layer 128b. The contact window 108 and the conductive wire 112 may respectively be formed via a single damascene process. The via 124 and the conductive wire 126 may be formed by a double damascene process, so that a top surface of the via 124 and a top surface of the conductive wire 126 are substantially coplanar, but are not limited thereto.

The second metal internal connection structure 204 is located above the second element layer 202. The second metal internal connection structure 204 may have similar or different components from the first metal internal connection structure 104. In the embodiment, the second metal internal connection structure 204 having similar components as the first metal internal connection structure 104 is taken as an example for description, but the disclosure is not limited thereto. The second metal internal connection structure 204 includes components such as an inner layer dielectric layer 206, a contact window 208, an interlayer dielectric layer 210, a conductive wire 212, an etch stop layer 214, an interlayer dielectric layer 216, hard mask layers 218 and 220, an interlayer dielectric layer 222, a via 224, and a topmost conductive wire 226. In some embodiments, there are other conductive wires, interlayer dielectric layers, and vias between the conductive wire 212 and the via 224, which are not shown.

The contact window 208, the conductive wire 212, the via 224, and the conductive wire 226 may be electrically connected to each other and to elements in the element layer 202. The contact window 208 includes a metal layer 208a and a barrier layer 208b, the conductive wire 212 includes a metal layer 212a and a barrier layer 212b, the via 224 and the conductive wire 226 include a metal layer 228a and a barrier layer 228b. Materials and forming methods of each of the components of the second metal internal connection structure 204 may be similar to the materials and the formation method of each of the components of the first metal internal connection structure 104, which are not repeated here.

The first bonding structure 130 is located above the first metal internal connection structure 104. The second bonding structure 230 is located above the second metal internal connection structure 204. The first bonding structure 130 includes a first insulation layer 132 and a first pad 134. The second bonding structure 230 includes a second insulation layer 232 and a second pad 234.

Materials of the first insulation layer 132 and the second insulation layer 232 respectively include silicon oxide, silicon nitride, or a combination thereof, and a formation method is, for example, a chemical vapor deposition method. The materials of the first insulation layer 132 and the second insulation layer 232 may be the same or different.

The first pad 134 is located in the first insulation layer 132, and the second pad 234 is located in the second insulation layer 232. The first pad 134 includes a metal layer 134a and a barrier layer 134b, and the second pad 234 includes a metal layer 234a and a barrier layer 234b. The metal layers 134a and 234a are, for example, aluminum, copper, or an alloy thereof. The barrier layer 134b is located between the metal layer 134a and the first insulation layer 132. The barrier layer 234b is located between the metal layer 234a and the second insulation layer 232. The barrier layers 134b and 234b are, for example, Ti, TiN, Ta, TaN, or a combination thereof. A formation method of the first pad 134 and the second pad 234 is, for example, using lithography and an etching process to respectively form openings in the first insulation layer 132 and the second insulation layer 232, and then sequentially forming a barrier material layer and a metal material layer. Subsequently, a planarization process, such as a chemical mechanical polishing method, is used to remove the excessive barrier material layer and metal material layer on the first insulation layer 132, so that a top surface of the first pad 134 and a top surface of the first insulation layer 132 are substantially coplanar, and a top surface of the second pad 234 and a top surface of the second insulation layer 232 are substantially coplanar.

In the embodiment of the disclosure, the first pad 134 and the second pad 234 are each respectively elongated, such as a rectangle, a rectangle with rounded corners, an oblong, or a parallelogram, as respectively shown in FIGS. 4A, 4B, 4C, and 4D. The shapes of the first pad 134 and the second pad 234 may be the same or different.

Figure 5A:
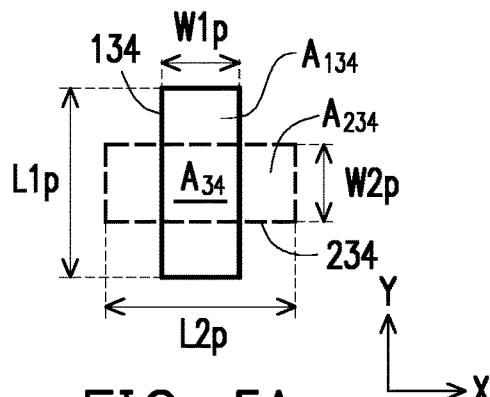
FIGS. 5A to 5H are top views of the various pads bonded to each other.
Figure 5B:
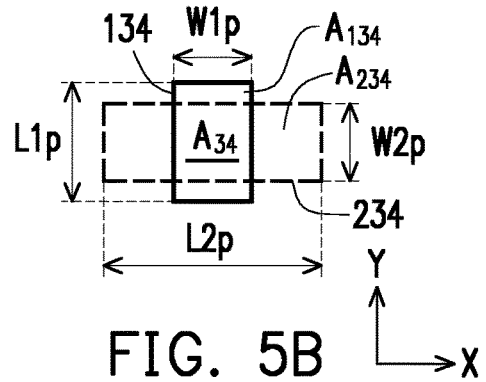
Figure 5C:
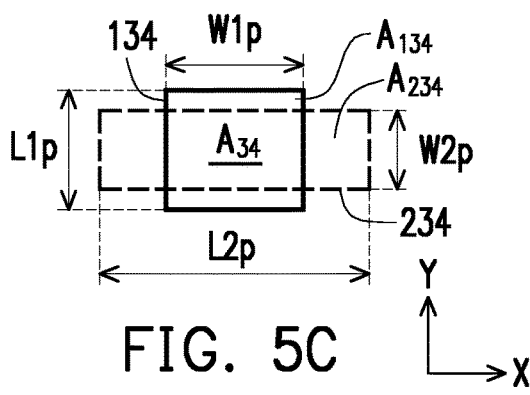
Figure 5D:
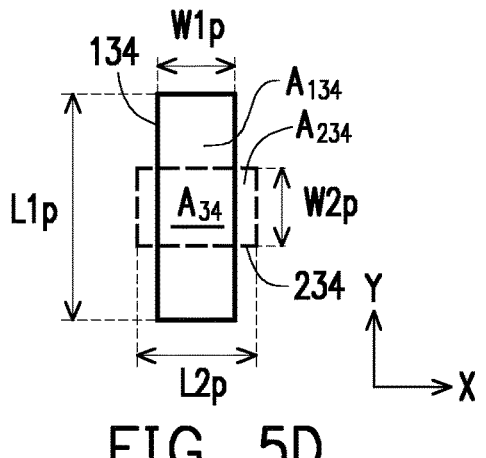

With reference to FIG. 1A, a range of a width $W1_P$ of the first pad 134 and a range of a width $W2_P$ of the second pad 234 are respectively from 0.8 μm to 6 μm. The width $W1_P$ of the first pad 134 and a length $L2_P$ range of the second pad 234 are respectively, for example, 1 μm to 10 μm. A range of a ratio $R_1$ of the length L1 to the width $W1_P$ of the first pad 134 and a range of a ratio $R_2$ of the length $L2_P$ to the width $W2_P$ of the second pad 234 are respectively, for example, 1.1 to 2.33. The width $W1_P$ of the first pad 134 and the width $W2_P$ of the second pad 234 may be the same (as shown in FIGS. 5A, 5B, and 5D to 5F) or different (as shown in FIGS. 5C, 5Q and 5H). The length L1 of the first pad 134 and the length $L2_P$ of the second pad 234 may be the same (as shown in FIGS. 5A, 5E, 5F, and 5H) or different (as shown in FIGS. 5B to 5D).

Figure 5E:
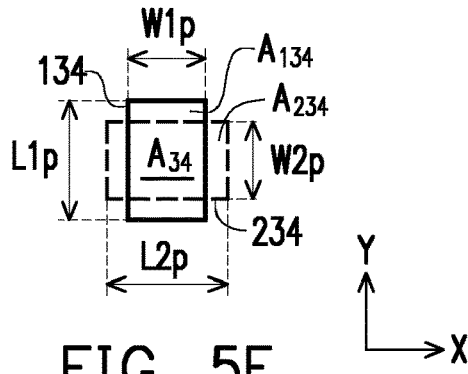
Figure 5F:
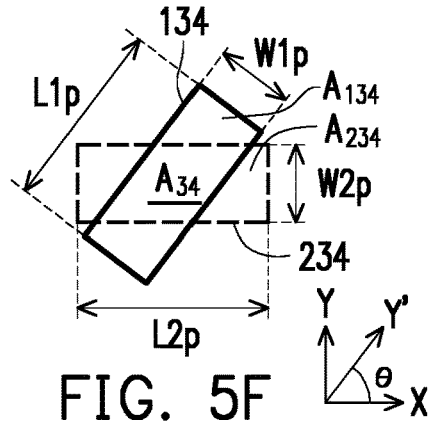
Figure 5G:
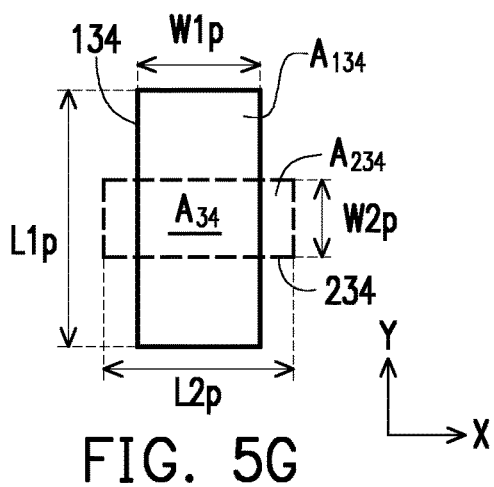
Figure 5H:
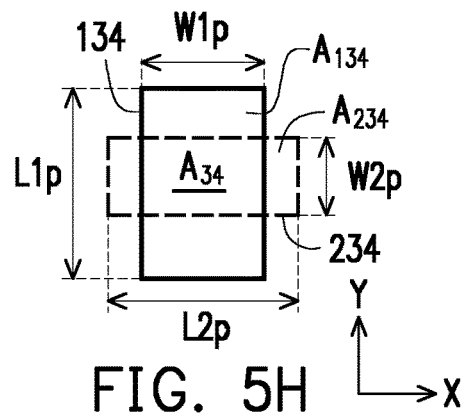

The ratio $R_1$ of the length L1 to the width $W1_P$ of the first pad 134 and the ratio $R_2$ of the length $L2_P$ to the width $W2_P$ of the second pad 234 may be the same (as shown in FIGS. 5A, 5E to 5G) or different (as shown in FIGS. 5B to 5D, and 5H). In some embodiments, the ratio $R_1$ is the same as the ratio $R_2$, the width $W1^P$ is the same as the width $W2_P$, and the length L1 is the same as the length $L2_P$, as shown in FIGS. 5A, 5E, and 5F. In other embodiments, the ratio $R_1$ is the same as the ratio $R_2$, but the width $W1_P$ is different from the width $W2_P$, and the length L1 is different from the length $L2_P$, as shown in FIG. 5G. In some embodiments, the ratio $R_1$ is different from the ratio $R_2$, the length L1 is different from the length $L2_P$, but the width $W1_P$ is the same as the width $W2_P$, as shown in FIGS. 5B and 5D. In other embodiments, the ratio $R_1$ is different from the ratio $R_2$, the width $W1_P$ is different from the width $W2_P$, but the length L1 is the same as the length $L2_P$, as shown in FIG. 5H. In yet other embodiments, the ratio $R_1$ is different from the ratio $R_2$, the width $W1_P$ is different from the width $W2_P$, and the length L1 is different from the length $L2_P$, as shown in FIG. 5C.

In the embodiment of the disclosure, an extension direction of the first pad 134 is different from an extension direction of a corresponding second pad 234. Here, the extension direction of the first pad 134 refers to an extension direction of a long side of the first pad 134. The extension direction of the second pad 234 refers to an extension direction of a long side of the second pad 234. The extension direction of the first pad 134 and the extension direction of the corresponding second pad 234 are perpendicular to each other, or form an acute angle θ in-between. For example, the first pad 134 extends in a Y direction, the corresponding second pad 234 extends in an X direction, and the X direction and the Y direction are perpendicular to each other, as shown in FIGS. 1A and 5A to 5E. The first pad 134 extends in a Y' direction, the corresponding second pad 234 extends in the X direction, in which the Y' direction and the X direction form an acute angle θ in-between, as shown in FIG. 5F.

In FIG. 1A, all of the first pads 134 extend in the Y direction, and all of the second pads 234 extend in the X direction. However, the disclosure is not limited thereto. In another embodiment, a portion of the first pads 134 extends in the Y direction, and a corresponding portion of the second pads 234 extends in the X direction. Another portion of the first pads 134 extends in the X direction, and a corresponding another portion of the second pads 234 extends in the Y direction (not shown).

In addition, the first pads 134 may include a single group (not shown) or multiple groups $G_{11}$ and $G_{12}$. The second pads 234 may include a single group (not shown) or multiple groups $G_{21}$ and $G_{22}$. The first pads 134 and the second pads 234 may be respectively arranged as an array aligned with each other, such as the groups $G_{12}$ and $G_{22}$, or an array that is staggered, such as the groups $G_{11}$ and $G_{21}$.

With reference to FIGS. 1A and 2A, the first pad 134 is electrically connected to the conductive wire 126 below. The second pad 234 is electrically connected to the conductive wire 226 below. The conductive wire 126 is a topmost conductive wire of the first metal internal connection structure 104, and may also be referred to as the first conductive wire 126. The conductive wire 226 is a topmost conductive wire of the second metal internal connection structure 204, and may also be referred to as the first conductive wire 226. In the embodiment of the disclosure, the extension direction of the first pad 134 is the same as an extension direction of the first conductive wire 126, and the extension direction of the second pad 234 is the same as an extension direction of the second conductive wire 226, as shown in FIGS. 1A, and 6A to 6F.

Figure 6A:
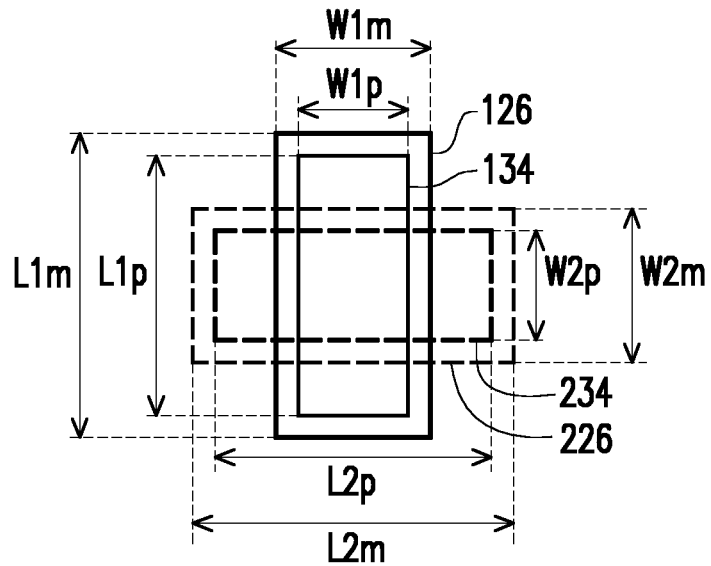
FIGS. 6A to 6F are top views of the various pads and conductive wires bonded to each other.
Figure 6B:
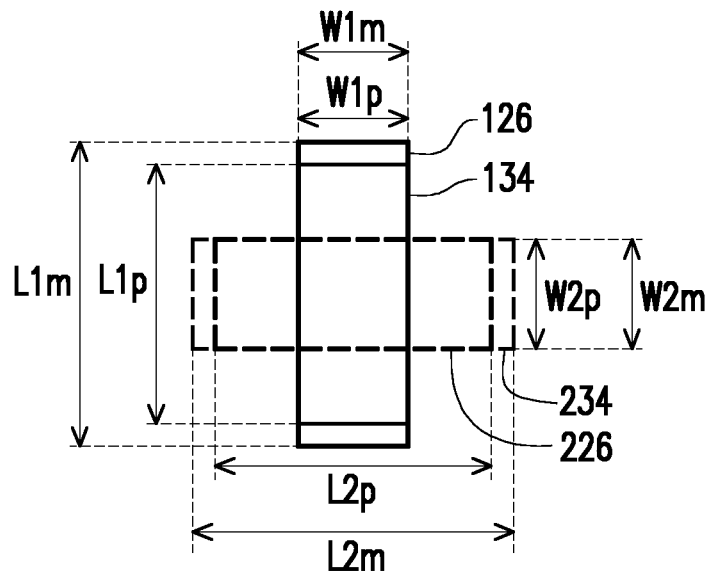
Figure 6C:
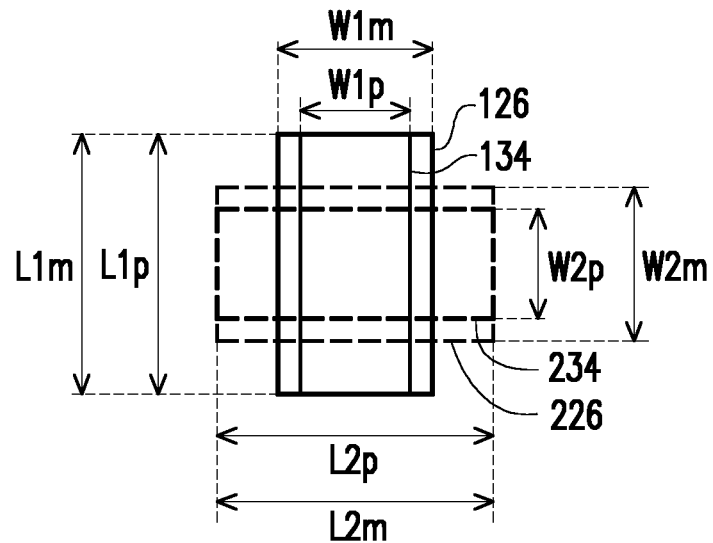
Figure 6D:
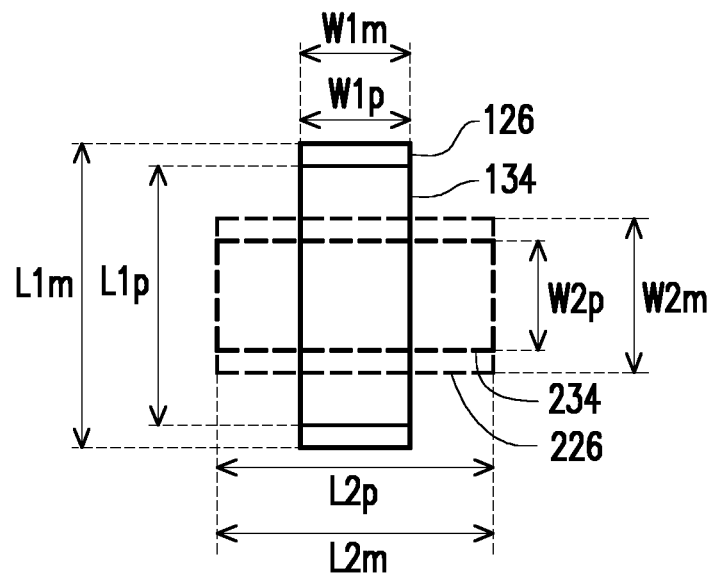
Figure 6E:
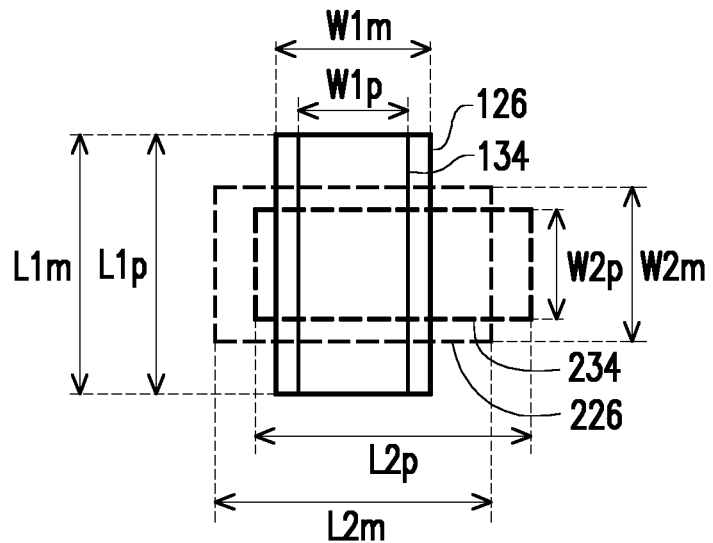
Figure 6F:
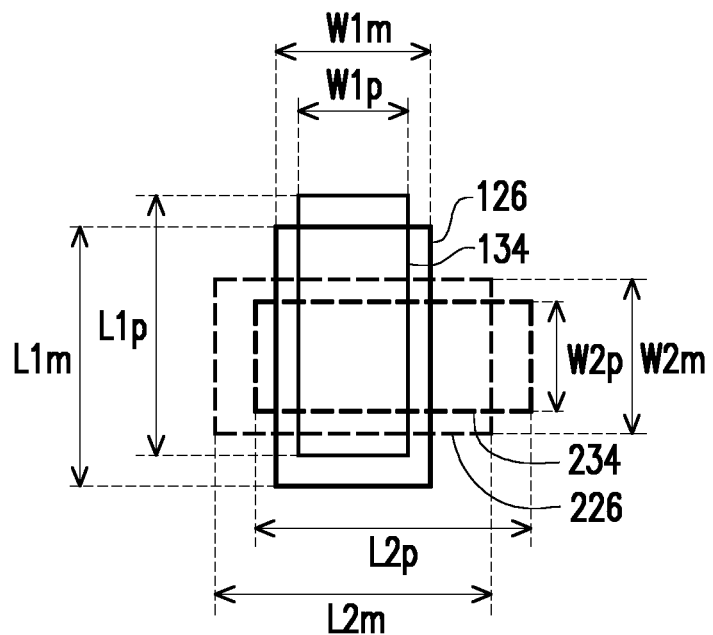

The first pad 134 may completely overlap (as shown in FIGS. 1A and 6A to 6D) or partially overlap (as shown in FIG. 6F) the first conductive wire 126. The second pad 234 may completely overlap (as shown in FIGS. 1A and 6A to 6D) or partially overlap (as shown in FIGS. 6E and 6F) the second conductive wire 226.

The width $W1_P$ of the first pad 134 may be smaller than a width $W1_m$ of the first conductive wire 126 (as shown in FIGS. 6A, 6C, 6E, and 6F), or equal to the width $W1_m$ of the first conductive wire 126 (as shown in FIGS. 6B and 6D).

The width $W2_P$ of the second pad 234 may be smaller than a width $W2_m$ of the second conductive wire 226 (as shown in FIGS. 6A, 6C, 6D, 6E, and 6F), or equal to the width $W2_m$ of the second conductive wire 226 (as shown in FIG. 6B).

The length L1 of the first pad 134 may be smaller than a length $L1_m$ of the first conductive wire 126 (as shown in FIGS. 6A, 6B, 6D, and 6F), or equal to the length $L1_m$ of the first conductive wire 126 (as shown in FIGS. 6C and 6E). The length $L2_P$ of the second pad 234 may be smaller than a length $L2_m$ of the second conductive wire 226 (as shown in FIGS. 6A and 6B), or equal to the length $L2_m$ of the second conductive wire 226 (as shown in FIGS. 6C to 6F).

With reference to FIGS. 1B and 2B, by bonding the first bonding structure 130 to the second bonding structure 230, so as to bond the first semiconductor wafer 100W to the second semiconductor wafer 200W to form a semiconductor device 1000A. The first semiconductor wafer 100W is bonded on the second semiconductor wafer 200W to form a semiconductor device 1000B, as shown in FIG. 2B. FIG. 3A is a partial enlarged view of an area enclosed by a dotted line in FIG. 2B. In another embodiment, the second semiconductor wafer 200W is bonded on the first semiconductor wafer 100W to form the semiconductor device 1000B, and a partial cross-sectional view of which is shown in FIG. 3B.

Figure 3B:
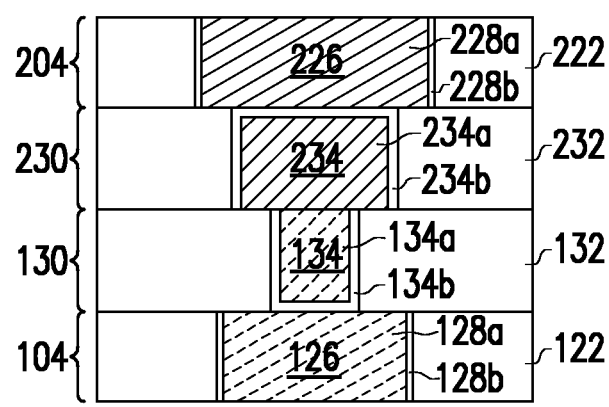
FIG. 3B is a partial cross-sectional view of another semiconductor device.
Figure 4A:
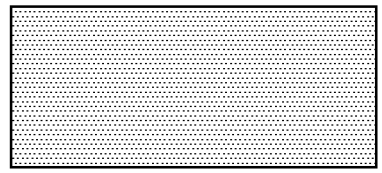
FIGS. 4A to 4D are top views of various elongated pads.
Figure 4B:
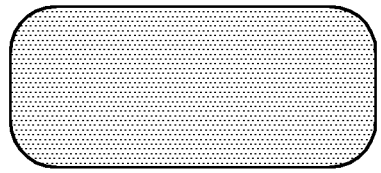
Figure 4C:
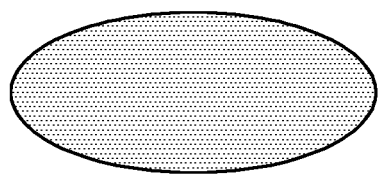
Figure 4D:
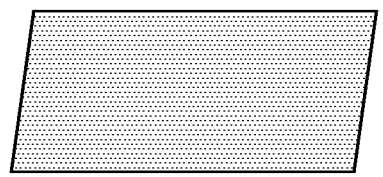

With reference to FIGS. 3A and 3B, the first insulation layer 132 of the first bonding structure 130 is bonded to the second insulation layer 232 of the second bonding structure 230. The first pad 134 of the first bonding structure 130 is bonded to the second pad 234 of the second bonding structure 230 and is electrically connected to each other.

In some embodiments of the disclosure, the extension direction of the first pad 134 and the extension direction of the second pad 234 are perpendicular to each other, and the first pad 134 and the second pad 234 form a "cross" shape after bonding, as shown in FIGS. 5A to 5E, 5G and 5H. In another embodiment, the extension direction of the first pad 134 and the extension direction of the second pad 234 form an acute angle θ in-between, and the first pad 134 and the second pad 234 form an "X" shape after bonding, as shown in FIG. 5F.

An overlapping region (or referred to as a bonded region) $A_{34}$ of the first pad 134 and the second pad 234 may have various shapes, such as a square, a rectangle, or a parallelogram, as shown in FIGS. 5A to 5H. With reference to FIG. 5C, the length $L2_P$ of the second pad 234 is greater than the width $W1_P$ of the first pad 134, so that the overlapping region (or referred to as the bonded region) $A_{34}$ is rectangular, which may be used when there is a misalignment with a larger deviation in the X direction, and may increase an area of the overlapping region (or referred to as the bonded region) $A_{34}$.

With reference to FIGS. 5A to 5F, the area of the overlapping region $A_{34}$ of the first pad 134 and the second pad 234 (or referred to as a bonding area) may be less than, equal to, or greater than a sum of areas of non-overlapping regions $A_{134}$ of the first pad 134 that do not overlap the second pad 234. The area of the overlapping region $A_{34}$ of the second pad 234 and the first pad 134 (or referred to as the bonding area) may be less than, equal to, or greater than a sum of areas of non-overlapping regions $A_{234}$ of the second pad 234 that do not overlap the first pad 134.

Figure 7A:
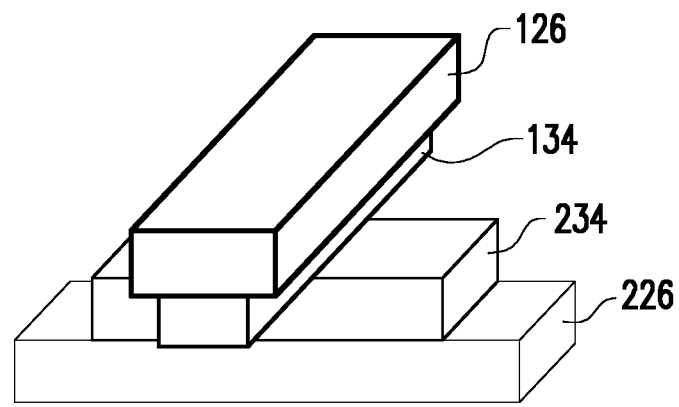
FIG. 7A is a perspective view of a pad and a conductive wire that are aligned and bonded.
Figure 7B:
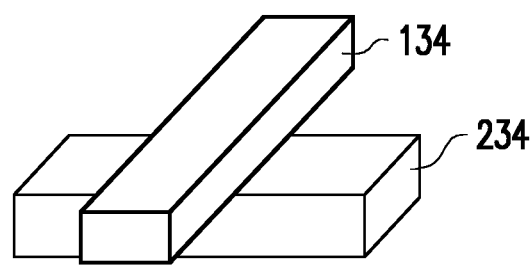
FIG. 7B is a perspective view of the aligned and bonded pad in FIG. 7A.
Figure 7C:
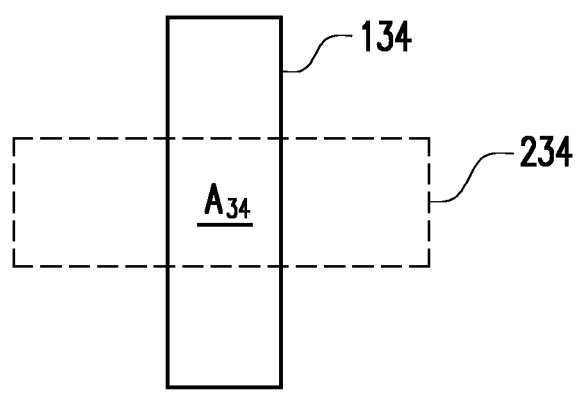
FIG. 7C is a top view of the aligned and bonded pad in FIG. 7B.
Figure 8A:
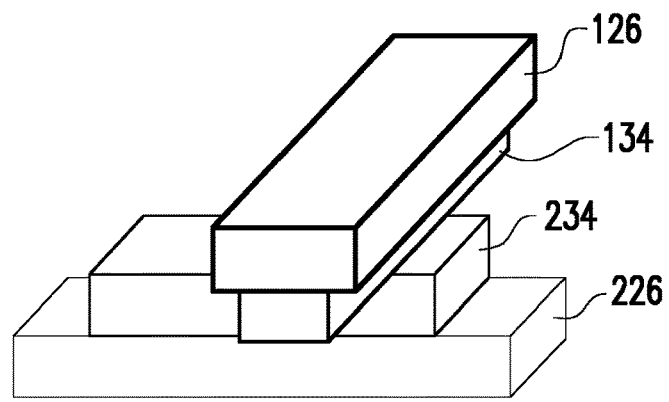
FIG. 8A is a perspective view of a pad and a conductive wire that are misaligned and bonded.
Figure 8B:
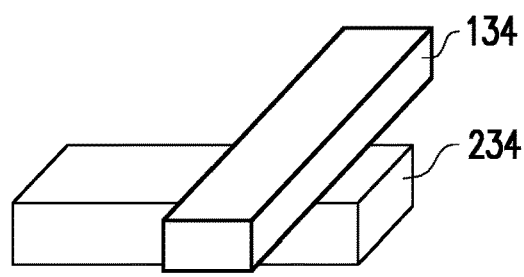
FIG. 8B is a perspective view of the misaligned and bonded pad in FIG. 8A.
Figure 8C:
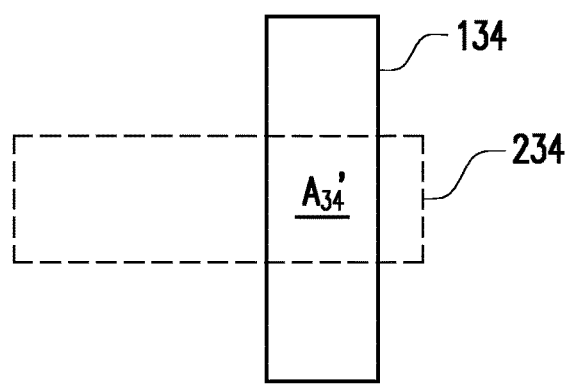
FIG. 8C is a top view of the misaligned and bonded pad in FIG. 8B.

FIG. 7A is a perspective view of a pad and a conductive wire that are aligned and bonded. FIG. 7B is a perspective view of the aligned and bonded pad in FIG. 7A. FIG. 7C is a top view of the aligned and bonded pad in FIG. 7B. FIG. 8A is a perspective view of a pad and a conductive wire that are misaligned and bonded. FIG. 8B is a perspective view of the misaligned and bonded pad in FIG. 8A. FIG. 8C is a top view of the misaligned and bonded pad in FIG. 8B.

With reference to FIGS. 1A and 7A to 7C, in an embodiment, when the first semiconductor wafer 100W and the second semiconductor wafer 200W are aligned and bonded, the overlapping region $A_{34}$ of the first pad 134 and the second pad 234 is approximately located in a center of the pad 134 and the second pad 234. With reference to FIGS. 1A and 8A to 8C, in an embodiment, when there is a misalignment during the bonding of the first semiconductor wafer 100W and the second semiconductor wafer 200W, the overlapping region $A_{34}'$ of the first pad 134 and the second pad 234 deviates from the center of the first pad 134 and the second pad 234. However, it may be seen from FIGS. 7C and 8C that an area of the misaligned and bonded overlapping region $A_{34}'$ and the area of the aligned and bonded overlapping region $A_{34}$ hardly changes. Therefore, the disclosure may enable the semiconductor device to have a uniformed bonding area.

In some embodiments, after the semiconductor device 1000A or 1000B is formed, the semiconductor device 1000A or 1000B is further cut into multiple stacked dies, which is not described in detail here.

The above embodiments are described by wafer-to-wafer bonding. However, the embodiments of the disclosure are not limited thereto. The embodiments of the disclosure may also include die-to-wafer bonding.

In summary, in the semiconductor device according to the embodiments of the disclosure, by bonding the multiple pads of the two semiconductor substrates with elongated shapes and different extension directions, a uniformed bonding area may be obtained, and the influence of the misalignment on the bonding area of the pads may be reduced, the bonding area is increased, and the flexibility of the design is increased.

Finally, it should be noted that the above embodiments are only used to illustrate the technical solutions of the disclosure, and are not intended to limit them. Although the disclosure has been described in detail with reference to the foregoing embodiments, those of ordinary skill in the art should understand that they can still make changes and modifications to the technical solutions described in the foregoing embodiments, or equivalently replace some or all of the technical features without departing from the spirit and the scope of the disclosure. Accordingly, the scope of the disclosure is defined by the claims appended hereto and their equivalents in which all terms are meant in their broadest reasonable sense unless otherwise indicated.

What is claimed is:

1. A semiconductor device, comprising:
   a first semiconductor substrate;
   a first bonding structure, located on the first semiconductor substrate, wherein the first bonding structure comprises a first pad having an elongated shape;
   a second semiconductor substrate; and
   a second bonding structure, located on the second semiconductor substrate, wherein the second bonding structure comprises a second pad having an elongated shape,
   wherein the first semiconductor substrate is bonded to the second semiconductor substrate by bonding the first bonding structure and the second bonding structure, the first pad is bonded to the second pad, and an extension direction of the first pad is different from an extension direction of the second pad, wherein the first semiconductor substrate comprises a first conductive wire, the second semiconductor substrate comprises a second conductive wire, the first conductive wire is connected the first pad, and the second conductive wire is connected to the second pad, and in a top view, the first conductive wire encloses the first pad, and the second conductive wire encloses the second pad.

2. The semiconductor device according to claim 1, wherein the first pad and the second pad are each respectively a rectangle, a rounded rectangle, an oblong, or a parallelogram.

3. The semiconductor device according to claim 1, wherein the extension direction of the first pad and the extension direction of the second pad are perpendicular to each other.

4. The semiconductor device according to claim 1, wherein the extension direction of the first pad and the extension direction of the second pad form an acute angle in-between.

5. The semiconductor device according to claim 1, wherein a ratio of a length to a width of the first pad is same as a ratio of a length to a width of the second pad.

6. The semiconductor device according to claim 5, wherein the width of the first pad is same as the width of the second pad.

7. The semiconductor device according to claim 5, wherein the width of the first pad is different from the width of the second pad.

8. The semiconductor device according to claim 1, wherein a ratio of a length to a width of the first pad is different from a ratio of a length to a width of the second pad.

9. The semiconductor device according to claim 8, wherein the width of the first pad is same as the width of the second pad, or the length of the first pad is same as the length of the second pad.

10. The semiconductor device according to claim 8, wherein the width of the first pad is different from the width of the second pad, and the length of the first pad is different from the length of the second pad.

11. The semiconductor device according to claim 1, wherein an overlapping region of the first pad and the second pad is a square, a rectangle, or a parallelogram.

12. The semiconductor device according to claim 1, wherein an area of an overlapping region of the first pad and the second pad is smaller than a sum of areas of non-overlapping regions of the first pad that do not overlap the second pad.

13. The semiconductor device according to claim 12, wherein the area of the overlapping region of the second pad and the first pad is smaller than a sum of areas of non-overlapping regions of the second pad that do not overlap the first pad.

14. The semiconductor device according to claim 1, wherein the first pad and the second pad form a "cross" shape or an "X" shape after bonding.

15. The semiconductor device according to claim 1, wherein the first semiconductor substrate further comprises a first conductive wire, the second semiconductor substrate further comprises a second conductive wire, the extension direction of the first pad is same as an extension direction of the first conductive wire and the first pad is connected to the first conductive wire, and the extension direction of the second pad is same as an extension direction of the second conductive wire and the second pad is connected to the second conductive wire.

16. The semiconductor device according to claim 15, wherein a width of the first pad is less than or equal to a width of the first conductive wire.

17. The semiconductor device according to claim 15, wherein a width of the second pad is less than or equal to a width of the second conductive wire.

18. The semiconductor device according to claim 15, wherein the first pad completely overlaps or partially overlaps the first conductive wire, and the second pad completely overlaps or partially overlaps the second conductive wire.

\* \* \* \* \*